US012702069B2

(12) United States Patent
Chen et al.

(10) Patent No.: US 12,702,069 B2
(45) Date of Patent: ***Aug. 4, 2026

(54) COMPOSITE DIELECTRIC STRUCTURES FOR SEMICONDUCTOR DIE ASSEMBLIES AND ASSOCIATED SYSTEMS AND METHODS

(71) Applicant: Micron Technology, Inc., Boise, ID (US)

(72) Inventors: Hung Cheng Chen, Taichung (TW); Yu Chun Chen, Taichung (TW); Hsuan Chao Hou, Taichung (TW)

(73) Assignee: Micron Technology, Inc., Boise, ID (US)

( * ) Notice: Subject to any disclaimer, the term of this patent is extended or adjusted under 35 U.S.C. 154(b) by 254 days.

This patent is subject to a terminal disclaimer.

(21) Appl. No.: 18/401,018

(22) Filed: Dec. 29, 2023

(65) Prior Publication Data

US 2024/0145436 A1 May 2, 2024

Related U.S. Application Data

(63) Continuation of application No. 17/402,947, filed on Aug. 16, 2021, now Pat. No. 11,862,607.

(51) Int. Cl.
*H10W 90/00* (2026.01)
*H10W 20/00* (2026.01)
(Continued)

(52) U.S. Cl.
CPC ......... *H10W 90/00* (2026.01); *H10W 20/057* (2026.01); *H10W 70/611* (2026.01);
(Continued)

(58) Field of Classification Search
CPC ........ H01L 21/08; H01L 21/79; H10W 90/00; H10W 20/057; H10W 70/635; H10W 70/65; H10W 90/401; H10W 70/611
(Continued)

(56) References Cited

U.S. PATENT DOCUMENTS 10,115,527 B2 * 10/2018 Zelner .................. H01G 4/1227
11,862,607 B2 * 1/2024 Chen ...................... H01L 24/80
(Continued)

FOREIGN PATENT DOCUMENTS

DE 102020101246 A1 * 3/2021 ....... H01L 21/28518
TW I445478 B 7/2014
(Continued)

OTHER PUBLICATIONS

China office action received in CN App No. 202210805751.5 dated Feb. 10, 2026, pp. all.

*Primary Examiner* — Phuc T Dang
(74) *Attorney, Agent, or Firm* — Dorsey & Whitney LLP

(57) ABSTRACT

Composite dielectric structures for semiconductor die assemblies, and associated systems and methods are disclosed. In some embodiments, the composite dielectric structure includes a flexible dielectric layer configured to conform to irregularities (e.g., particles, defects) at a bonding interface of directly bonded semiconductor dies (or wafers). The flexible dielectric layer may include a polymer material configured to deform in response to localized pressure generated by the irregularities during bonding process steps. The composite dielectric structure includes additional dielectric layers sandwiching the flexible dielectric layer such that the composite dielectric structure can provide robust bonding strength to other dielectric layers through the additional dielectric layers. In some embodiments, a chemical vapor deposition process may be used to form the composite dielectric structure utilizing siloxane derivatives as a precursor.

17 Claims, 6 Drawing Sheets

(51) Int. Cl.
  *H10W 70/60*      (2026.01)
  *H10W 70/63*      (2026.01)
  *H10W 70/65*      (2026.01)

(52) U.S. Cl.
  CPC ......... *H10W 70/635* (2026.01); *H10W 70/65* (2026.01); *H10W 90/401* (2026.01)

(58) Field of Classification Search
  USPC ......................................................... 257/774
  See application file for complete search history.

(56)            References Cited

U.S. PATENT DOCUMENTS

| 2003/0228765 | A1* | 12/2003 | Miyajima ........... H01L 21/3212 |
| | | | 438/692 |
| 2013/0320503 | A1 | 12/2013 | Nuzzo et al. |

| 2017/0179356 | A1 | 6/2017 | Rogers et al. |
| 2018/0312784 | A1 | 11/2018 | Izadi et al. |
| 2019/0062153 | A1 | 2/2019 | Tseng et al. |
| 2019/0189889 | A1 | 6/2019 | Benedict et al. |
| 2020/0006540 | A1 | 1/2020 | Nuzzo et al. |
| 2020/0227340 | A1* | 7/2020 | Lu ....................... H01L 23/5283 |
| 2021/0125955 | A1 | 4/2021 | Suh et al. |
| 2021/0134694 | A1 | 5/2021 | Li et al. |
| 2023/0047231 | A1 | 2/2023 | Chen et al. |

FOREIGN PATENT DOCUMENTS

| TW | 201612991 | A | 4/2016 |
| TW | 201735320 | A | 10/2017 |
| TW | 201916190 | A | 4/2019 |
| TW | 202010026 | A | 3/2020 |
| TW | 202111491 | A | 3/2021 |
| TW | 202119473 | A | 5/2021 |

* cited by examiner

600

Provide a semiconductor die including a substrate having integrated circuitry    610

Form a dielectric structure over the substrate, the dielectric structure including:
a first dielectric layer located at a first side of the dielectric structure facing the substrate,
a second dielectric layer located at a second side of the dielectric structure opposite to the first side, and
a third dielectric layer between the first and second dielectric layers, the third dielectric layer configured to conform to one or more irregularities at the second side.    615

*Figure 6*

COMPOSITE DIELECTRIC STRUCTURES FOR SEMICONDUCTOR DIE ASSEMBLIES AND ASSOCIATED SYSTEMS AND METHODS

CROSS-REFERENCE TO RELATED APPLICATION(S)

This application is a continuation of U.S. patent application Ser. No. 17/402,947, filed Aug. 16, 2021, now U.S. Pat. No. 11,862,607, which is incorporated herein by reference in its entirety.

TECHNICAL FIELD

The present disclosure generally relates to semiconductor device assemblies, and more particularly relates to composite dielectric structures for semiconductor die assemblies and associated systems and methods.

BACKGROUND

Semiconductor packages typically include one or more semiconductor dies (e.g., memory chips, microprocessor chip, imager chip) mounted on a package substrate and encased in a protective covering. The semiconductor die may include functional features, such as memory cells, processor circuits, or imager devices, as well as bond pads electrically connected to the functional features. The bond pads can be electrically connected to corresponding conductive structures of the package substrate, which may be coupled to terminals outside the protective covering such that the semiconductor die can be connected to higher level circuitry.

In some semiconductor packages, two or more semiconductor dies are stacked on top of each other to reduce the footprint of the semiconductor packages. The semiconductor dies in the stack may be arranged in a pattern resembling stair-steps (which may be referred to as "shingle stacking") such that a portion of the semiconductor dies may be freely accessible—e.g., to attach bond wires to one or more bond pads located in the portion. In some cases, the semiconductor dies may be stacked in a "zig-zag" pattern to increase a space above the bond pads with respect to a semiconductor die overlying above the bond pads so as to facilitate forming the bond wires. Such arrangements, however, tend to increase overall heights of the semiconductor packages. Further, the bond wires may add to the heights and/or introduce delays in signal propagation.

BRIEF DESCRIPTION OF THE DRAWINGS

Many aspects of the present technology can be better understood with reference to the following drawings. The components in the drawings are not necessarily to scale. Instead, emphasis is placed on illustrating clearly the overall features and the principles of the present technology.

FIG. 6 is a flowchart of a method of making a composite dielectric structure in accordance with embodiments of the present technology.

DETAILED DESCRIPTION

Figure 1:
FIG. 1 is an example schematic diagram of a semiconductor die assembly.
Figure 1:
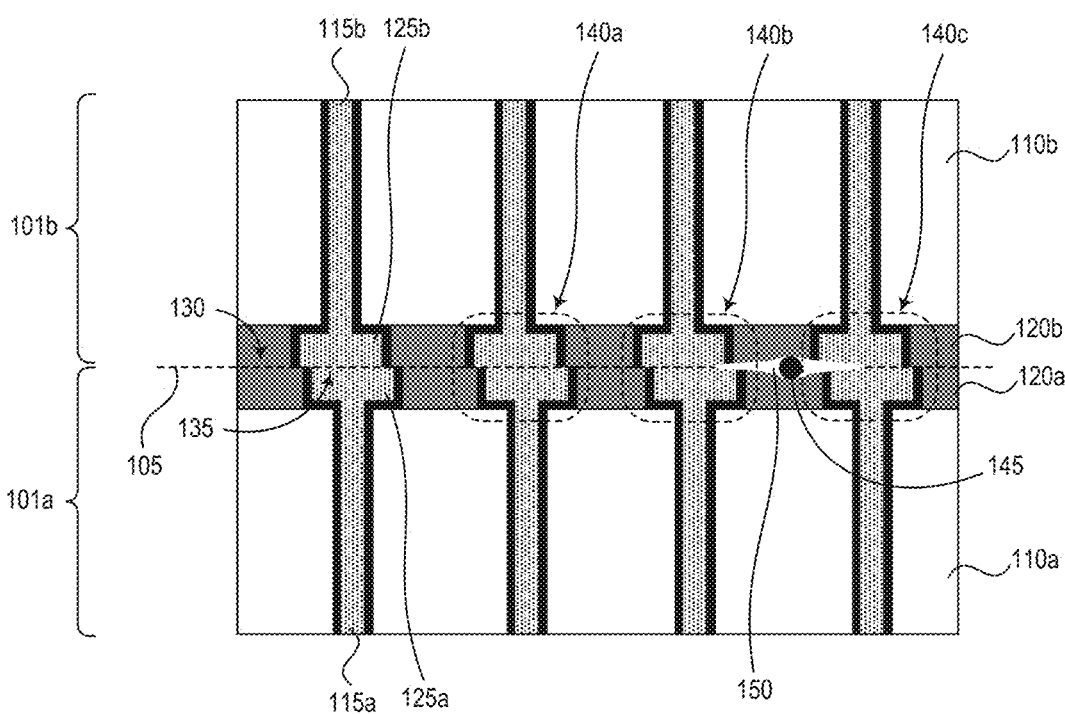

Specific details of several embodiments of composite dielectric structures for semiconductor die assemblies, and associated systems and methods are described below. The term "semiconductor device or die" generally refers to a solid-state device that includes one or more semiconductor materials. Examples of semiconductor devices (or dies) include logic devices or dies, memory devices or dies, controllers, or microprocessors (e.g., central processing unit (CPU), graphics processing unit (GPU)), among others. Such semiconductor devices may include integrated circuits or components, data storage elements, processing components, and/or other features manufactured on semiconductor substrates. Further, the term "semiconductor device or die" can refer to a finished device or to an assembly or other structure at various stages of processing before becoming a finished functional device. Depending upon the context in which it is used, the term "substrate" may include a semiconductor wafer, a package substrate, a semiconductor device or die, or the like. Suitable steps of the methods described herein can be performed with processing steps associated with fabricating semiconductor devices (wafer-level and/or die-level) and/or manufacturing semiconductor packages.

Various computing systems or environments, e.g., high-performance computing (HPC) systems, require high bandwidth and low power consumption. Certain schemes of forming interconnects between semiconductor dies (e.g., a direct bonding scheme) may facilitate satisfying the requirements, as well as providing form-factors suitable for scaling physical dimensions (e.g., heights) of semiconductor die assemblies of the HPC systems. The direct bonding scheme includes individual conductive components (e.g., copper pads, conductive pads) of a first semiconductor die (or a first wafer including the first semiconductor die) aligned and directly bonded to corresponding one of conductive components of a second semiconductor die (or a second wafer including the second semiconductor die). Further, a dielectric material surrounding each of the conductive components of the first semiconductor die can be directly bonded to another dielectric material surrounding each of the conductive components of the second semiconductor die. In other words, the bonding interface includes two or more dissimilar materials of the first semiconductor die directly bonded to corresponding materials of the second semiconductor die (e.g., between dielectric materials, between conductive materials) to form interconnects and surrounding dielectric layers. As such, the direct bonding scheme may also be referred to a combination bonding scheme, a hybrid bonding scheme, or the like.

In some embodiments, the conductive materials include copper (or other suitable conductive materials or metals, such as tungsten (W)) as a primary constituent, and the dielectric materials include silicon oxides (e.g., $SiO_2$), silicon nitrides (e.g., $Si_3N_4$), silicon carbon nitrides (e.g., SiCN), silicon carbonates (e.g., SiCO), or the like. During the direct bonding process, the dielectric materials of the first and second semiconductor dies (or the first and second wafers including the first and second semiconductor dies) are brought together such that the dielectric materials adhere to each other. Subsequently, the semiconductor dies are annealed at an elevated temperature such that the conductive materials of the first and second semiconductor dies are conjoined to form permanent bonding—e.g., metallurgical bonding. Additionally, the dielectric materials may enhance their bonding strength during the annealing process. If any irregularities (e.g., defects, particles) exist at the bonding interface (which may also be referred to as a mating interface or a bond line), such irregularities would weaken the bonding strength between the semiconductor dies (or the wafers), for example by forming voids surrounding the irregularities, at least due to stiffness and/or brittleness of the dielectric materials.

In some cases, even if the direct bonding forms to hold the two semiconductor dies (or wafers) bonded together, the voids present at the bonding interface may interfere with forming robust interconnects between the conductive components. If portions of conductive components are not conjoined (e.g., fused) due to the voids, the interconnects including partially conjoined conductive components may have higher than desired resistance values. If the conductive components fail to form continuous conductive paths, the interconnects may suffer from electrical opens. In some cases, the voids may include the conductive materials that originate from the conductive components connected to the voids—e.g., through various mechanisms causing the conductive materials to migrate, such as extension, extrusion, diffusion, or the like. If the voids are large enough to reach multiple conductive components, the voids may serve as conduits for the conductive materials (e.g., Cu) to migrate such that undesired leakage paths and/or electrical shorts can occur between the conductive components. Accordingly, the environment for the direct bonding process needs to be ultra clean in order to avoid the particles at the bonding surfaces, which in turn, tends to increase the manufacturing cost.

The present technology mitigates risks associated with forming compromised bonding interfaces (e.g., voids weakening bonding strength, interconnects having partially conjoined conductive components, lateral leakage paths and/or electrical shorts between interconnects) by providing composite dielectric structures at the bonding interface. The composite dielectric structure includes a dielectric surface layer suitable for the direct bonding scheme (e.g., silicon oxides, silicon nitrides, silicon carbonates, etc.) such that the bonding strength provided by the dielectric surface layer can be maintained. Additionally, the composite dielectric structure includes a layer with elastic properties that can tolerate the irregularities (e.g., particles, defects) at the bonding interface—e.g., conforming to the shapes of the irregularities. In some embodiments, the layer with elastic properties may include a polymer material that is flexible to deform in response to localized pressure generated by the irregularities during the bonding process. For example, a chemical vapor deposition (CVD) process may be used to deposit a flexible dielectric layers to reduce and/or eliminate voids caused by the irregularities at the bonding interface—e.g., applying siloxane derivatives (e.g., hexamethyldisiloxane (HMDSO)) as a precursor.

In this manner, the composite dielectric structure can avoid forming the voids and/or substantially reduce sizes of the voids despite the irregularities that may be present at the bonding interface. As a result, the bonding interface can be improved to have enhanced bonding strength at least due to increased bonding areas, reduced quantities of interconnects having high resistance, reduced probabilities of forming leakage paths between interconnects, among others. Additionally, or alternatively, the direct bonding process employing the composite dielectric structures may be carried out in an environment with relatively lenient requirements directed to the particles, which in turn, may reduce the manufacturing cost.

As used herein, the terms "front," "back," "vertical," "lateral," "down," "up," "upper," and "lower" can refer to relative directions or positions of features in the semiconductor device assemblies in view of the orientation shown in the Figures. For example, "upper" or "uppermost" can refer to a feature positioned closer to the top of a page than another feature. These terms, however, should be construed broadly to include semiconductor devices having other orientations. Unless stated otherwise, terms such as "first" and "second" are used to arbitrarily distinguish between the elements such terms describe. Thus, these terms are not necessarily intended to indicate temporal or other prioritization of such elements.

FIG. 1 is an example schematic diagram 100 of a semiconductor die assembly. The diagram 100 illustrates a bonding interface 105 between semiconductor dies 101 (also identified individually as 101a/b) directly bonded to each other. The semiconductor dies 101 are depicted to include substrates 110 (also identified individually as 110a/b) and dielectric layers 120 (also identified individually as 120a/b). Moreover, the semiconductor dies 101 include through-substrate vias (TSVs) 115 (also identified individually as 115a/b) coupled to integrated circuitry (not shown) of the semiconductor dies 101. The TSVs 115 are also connected to corresponding conductive components 125 (also identified individually as 125a/b) of the semiconductor dies 101. As such, the conductive components 125 are operatively coupled to the integrated circuitry.

At the bonding interface 105, the dielectric layers 120a/b are directly bonded (e.g., conjoined, fused) to form the dielectric-to-dielectric bonding 130. Also, the conductive components 125a/b are directly bonded (e.g., conjoined, fused) to form the metal-to-metal bonding 135 at the bonding interface 105. Accordingly, the bonding interface 105 includes both the dielectric-to-dielectric bonding 130 and the metal-to-metal bonding 135, and may be referred to as combinational bonding interface or a hybrid bonding interface. The diagram 100 illustrates interconnects 140 (also identified individually as 140a-c) that each includes conjoined conductive components 125.

In some cases, the bonding interface 105 may include irregularities (e.g., defects, particles). For example, the diagram 100 illustrates an irregularity 145 at the bonding interface 105. The dielectric layers 120 (e.g., including SiO$_2$, SiCN) tend to be stiff and/or brittle such that the dielectric layers 120 may not locally conform to the irregularity 145 during the direct bonding process. As a result, voids (e.g., the void 150 depicted in the diagram 100) may form around the irregularity 145 at the bonding interface 105. As such, although overall direct bonding between the dielectric layers 120 may be established to bond the semiconductor dies 101 together, the bonding interface 105 may include such voids associated with the irregularities. Presence of the voids reduces overall area of the dielectric-to-dielectric bonding 130, and thus decreases the bonding strength of the bonding interface 105.

In some cases, certain voids formed at the bonding interface 105 may be sufficiently large to interfere with (hinder, impede) forming the metal-to-metal bonding 135.

For example, the void 150 may expand (encroach) into the interconnect 140c such that the metal-to-metal bonding of the interconnect 140c is compromised. As a result, the interconnect 140c may have a higher resistance than other interconnects 140 (e.g., the interconnect 140a). Such variations in electrical characteristics of the interconnects 140 may degrade performance of the semiconductor die assembly. If the size of the void 150 is large enough to prevent the interconnects 140 to form continuous current paths (e.g., resulting in electrical opens), such interconnects 140 may cause the semiconductor die assembly to fail to operate.

In some embodiments, the metal-to-metal bonding 135 may be formed by thermally expanding (e.g., through volume expansion in response to thermal energy applied during the direct bonding process) the conductive materials of the conductive components 125 (e.g., copper) after the semiconductor dies 101 are brought in contact with each other. Accordingly, the voids, if connected to the conductive components 125, may serve as conduits, through which the conductive materials can migrate. If the void 150 is large enough to bridge (or otherwise connect) two or more interconnects 140 as illustrated in the diagram 100, the void 150 including traces of conductive materials may result in undesired leakage paths and/or electrical shorts between the interconnects—e.g., between the interconnect 140b and the interconnect 140c.

Figure 2:
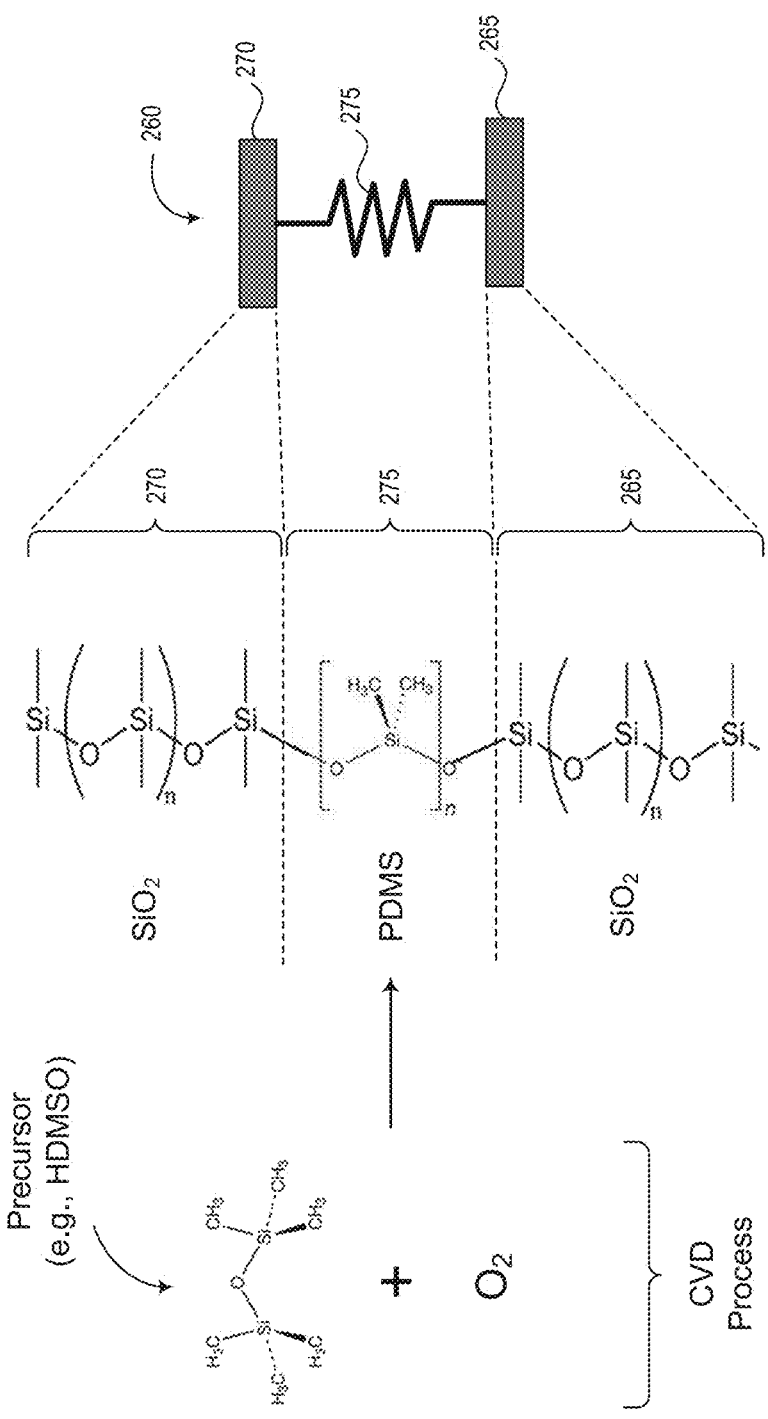
FIG. 2 is a schematic diagram of a composite dielectric structure in accordance with embodiments of the present technology.

FIG. 2 is a schematic diagram of a composite dielectric structure 260 in accordance with embodiments of the present technology. The composite dielectric structure 260 may facilitate tolerating the irregularities during the direct bonding process such that the quality of the bonding interface may be improved—e.g., mitigating adverse effects originating from the irregularities. The composite dielectric structure 260 includes a first dielectric layer 265, a second dielectric layer 270, and a third dielectric layer 275 between the first dielectric layer 265 and the second dielectric layer 270. The first and second dielectric layers 265 and 270 may include at least one of silicon oxides (e.g., $SiO_2$), silicon nitrides (e.g., $Si_3N_4$), silicon carbon nitrides (e.g., SiCN), silicon carbonates (e.g., SiCO), or the like. The first and second dielectric layers 265 and 270 are configured to provide robust bonding strength in contact with other dielectric layers as described in more detail with reference to FIGS. 3 and 4—e.g., a dielectric layer directly bonded to the second dielectric layer 270, a dielectric layer upon which the first dielectric layer 265 is deposited to form the composite dielectric structure 260.

The third dielectric layer 275 may be configured to conform to one or more irregularities that may be present at the bonding interface—e.g., the surface of the second dielectric layer 270. In some embodiments, the third dielectric layer 275 includes a polymer material that is flexible to deform in response to localized pressure generated by the one or more irregularities. In other words, the third dielectric layer 275 may have elastic properties that can tolerate the particles and/or defects present at the bonding interface. As such, the third dielectric layer 275 may be represented as a "resistive" or "spring-like" layer as depicted in FIG. 2. In this manner, the composite dielectric structure 260 can provide both the bonding strength of the dielectric material of the second dielectric layer 270, as well as the flexibility of the third dielectric layer 275 to tolerate the irregularities at the bonding interface. In this regard, the localized pressure stemming from the irregularities may be applied to (transferred to) the third dielectric layer 275 through the second dielectric layer 270 located at the bonding interface (e.g., the bonding interface 405 described with reference to FIG. 4).

In some embodiments, a CVD process may be used to deposit the first, second, and third dielectric layers as depicted in FIG. 2. For example, a semiconductor die (e.g., a semiconductor die 301 described with reference to FIG. 3 or a wafer including the semiconductor die 301, semiconductor dies 401 described with reference to FIG. 4 or a wafer including the semiconductor dies 401) may be placed in a CVD chamber configured to receive a first gas having oxygen (02) and a second gas having a precursor (e.g., hexadimethylsiloxane (HDMSO)) including the polymer material (e.g., polydimethylsiloxane (PDMS)). Subsequently, the first dielectric layer 265 (e.g., including $SiO_2$) may be formed by providing the first and second gases to the CVD chamber with a first ratio between the oxygen and the precursor. The first ratio can be configured to deposit $SiO_2$ on the semiconductor die (or the semiconductor wafer) to form the first dielectric layer 265. After a desired thickness of the first dielectric layer 265 is achieved, the third dielectric layer 275 (e.g., including PDMS) may be formed by modifying (e.g., decreasing) an amount of the first gas provided to the CVD chamber to establish a second ratio between the oxygen and the precursor. The second ratio can be configured to deposit the polymer material (e.g., PDMS) on the first dielectric layer 265 to form the third dielectric layer 275. After a desired thickness of the third dielectric layer 275 is achieved, the second dielectric layer 270 may be formed on the third dielectric layer 275 by restoring the amount of the first gas provided to the CVD chamber to establish the first ratio to deposit $SiO_2$ to form the second dielectric layer 270 on the third dielectric layer 275.

As described herein, process conditions for the CVD process may be modified by modifying the ratio between 02 and the precursor (e.g., HDMSO, other suitable siloxane derivatives) to vary relative contents of the polymer material and the $SiO_2$. In some embodiments, the third dielectric layer 275 includes the polymer material only. In other embodiments, the third dielectric layer 275 primarily includes the polymer material—e.g., the third dielectric layer 275 may partially include $SiO_2$ as well. Although the foregoing example CVD process utilizes the precursor configured to deposit $SiO_2$ and PDMS (a polymer material) based on the ratio between 02 and the precursor (HDMSO) in the CVD chamber, in other embodiments, different precursors (and/or one or more gases other than 02) may be provided to the CVD chamber so as to deposit the polymer material and at least one of silicon oxides (e.g., $SiO_2$), silicon nitrides (e.g., $Si_3N_4$), silicon carbon nitrides (e.g., SiCN), silicon carbonates (e.g., SiCO), or the like.

Figure 3:
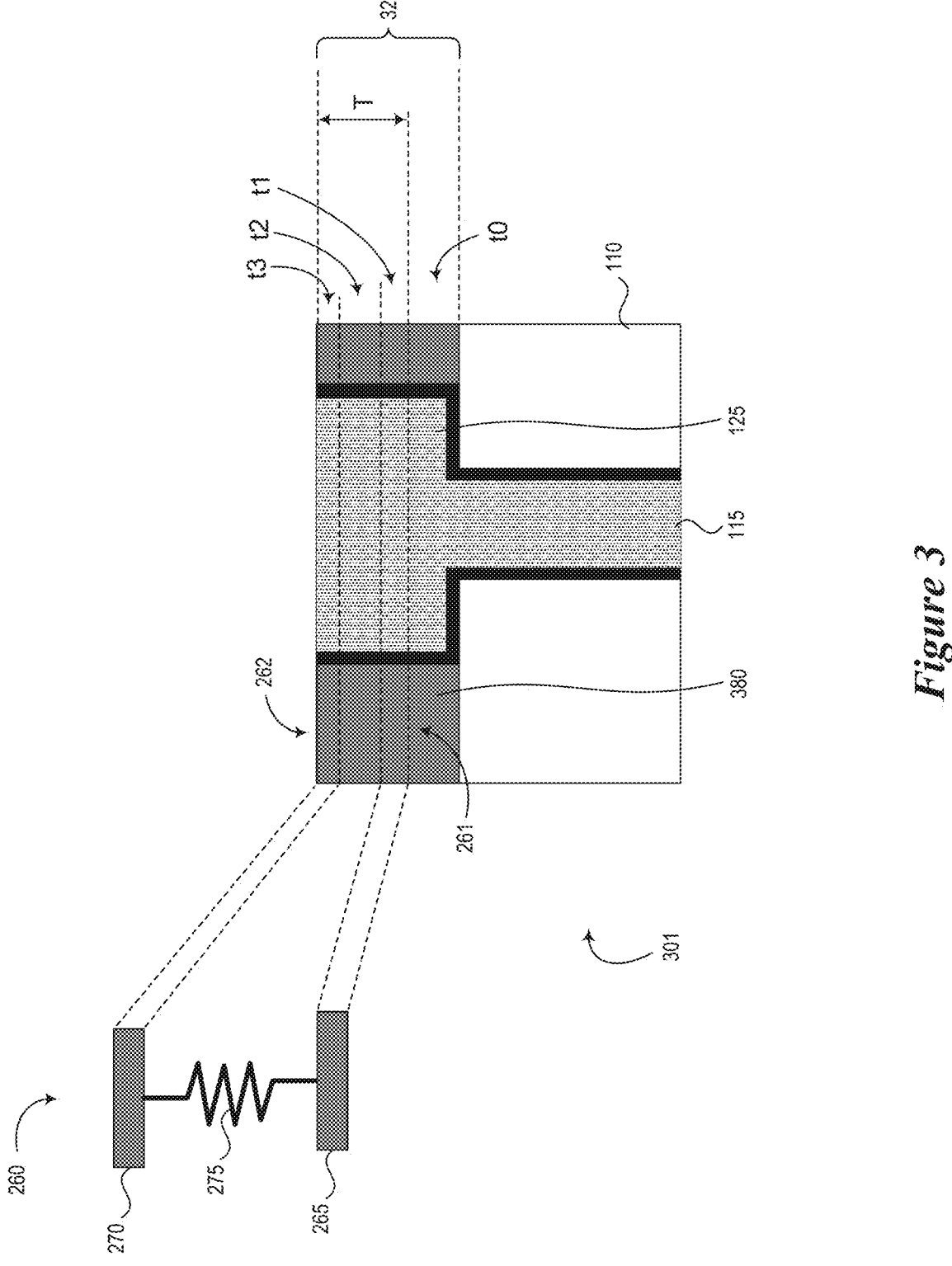
FIG. 3 is a schematic diagram of a semiconductor die including a composite dielectric structure in accordance with embodiments of the present technology.

FIG. 3 is a schematic diagram of a semiconductor die 301 including a composite dielectric structure (e.g., the composite dielectric structure 260 described with reference to FIG. 2) in accordance with embodiments of the present technology. The semiconductor die 301 may include aspects of the semiconductor dies 101 described with reference to FIG. 1. For example, the semiconductor die 301 includes the substrate 110 including integrated circuitry (not shown). The semiconductor die 301 also includes TSVs 115 (one of which is depicted in FIG. 3) coupled to the integrated circuitry.

Further, the semiconductor die 301 includes a dielectric layer 320 having the composite dielectric structure 260 over the substrate 110. In some embodiments, the dielectric layer 320 includes an additional dielectric layer 380 formed on the substrate 110, on which the composite dielectric structure 260 is formed. In some embodiments, the dielectric layer 380 may be formed using process steps utilizing tetraethyl orthosilicates (TEOS) or other suitable techniques to deposit dielectric materials—e.g., high plasma density (HDP) oxides.

The semiconductor die 301 also includes conductive components 125 (one of which is depicted in FIG. 3) coupled to the TSV 115. The conductive component 125 may also be referred to as conductive pads and configured to have physical dimensions (e.g., surface area, thickness) to provide adequate volume of conductive materials (e.g., copper) to form robust interconnects (e.g., the interconnects 440 depicted in FIG. 4) during the direct bonding process. In some embodiments, the conductive pads 125 can be formed in the dielectric layer 320—e.g., after the composite dielectric structure 260 (and the dielectric layer 380) is formed over the substrate 110. As such, each conductive pad 125 extends through the composite dielectric structure 260 and is surrounded by the composite dielectric structure 260 (e.g., surrounded by the first, second, and third dielectric layers of the composite dielectric structure 260).

Figure 4:
FIG. 4 is a schematic diagram of a semiconductor die assembly configured in accordance with embodiments of the present technology.
Figure 4:
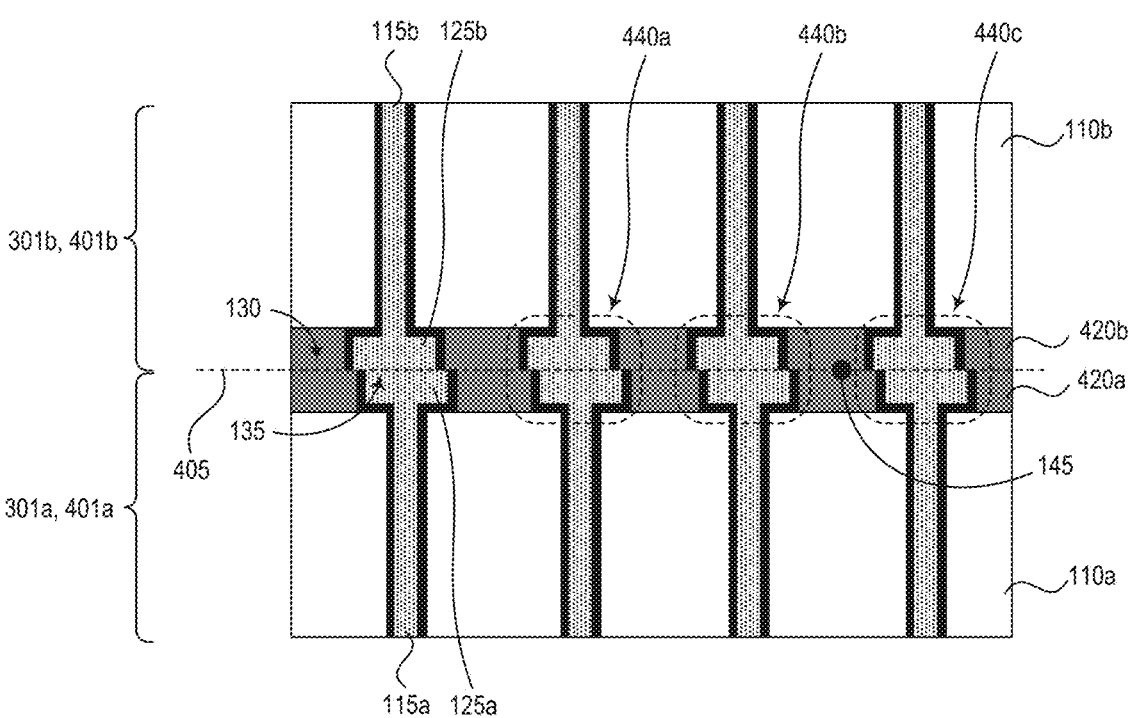

The composite dielectric structure 260 includes the first dielectric layer 265 located at a first side 261 of the composite dielectric structure 260 facing the substrate 110, the second dielectric layer 270 located at a second side 262 of the composite dielectric structure 260 opposite to the first side 261, and the third dielectric layer 275 between the first dielectric layers 265 and the second dielectric layer 270. In other words, the third dielectric layer 275 is sandwiched between the first and second dielectric layers 265 and 270. The second side 262 would form a bonding interface (e.g., the bonding interface 405 described with reference to FIG. 4) if directly bonded with another semiconductor die (e.g., the semiconductor die 101, the semiconductor die 401) as depicted in FIG. 4. The third dielectric layer 275 may be configured to conform to one or more irregularities at the second side 262—e.g., at the bonding interface during the direct bonding process. In some embodiments, the third dielectric layer 275 includes a polymer material (e.g., PDMS) that is flexible (e.g., having elastic material properties) to deform in response to localized pressure generated by the one or more irregularities (e.g., defects, particles) at the second side 262 during the direct bonding process. As such, the localized pressure may be applied to the third dielectric layer 275 through the second dielectric layer 270.

As described with reference to FIG. 2, the first, second, and third dielectric layers may be deposited during a CVD process by modifying the amounts of gas flows (e.g., the gas flows providing 02 and the precursor). In some embodiments, the third dielectric layer 275 includes the polymer material only. In other embodiments, the third dielectric layer 275 primarily includes the polymer material—e.g., having partial $SiO_2$ contents. Further, the second dielectric layer 270 may be configured to conform to the one or more irregularities at the second side 262. As such, in some embodiments, the second dielectric layer 270 may be configured to include partial polymer material contents. In other embodiments, the second dielectric layer 270 may not include any polymer material contents. In such embodiments, the second dielectric layer 270 may be formed thin enough to be flexible to deform in response to localized pressure generated by one or more irregularities. Further, the second dielectric layer 270 can be configured to directly bond to another dielectric layer in contact with the second dielectric layer 270 during the direct bonding process—e.g., if a second semiconductor die is directly bonded to the semiconductor die 301 as depicted in FIG. 4.

In some embodiments, the second dielectric layer 270 is at least 50 nm thick (denoted as t3 in FIG. 3), and the third dielectric layer 275 is at least twice thick (denoted as t2 in FIG. 3) as the second dielectric layer 270. In other embodiments, the second dielectric layer 270 is at least 100 nm thick, and the thickness of the third dielectric layer 275 may range between 200 to 500 nm. In some embodiments, the thickness of the third dielectric layer 275 is determined by the sizes of the one or more irregularities—e.g., based on the cleanroom environment, in which the direct bonding process is carried out.

In some embodiments, the first dielectric layer 265 may be configured to provide an adequate transition and/or adhesion between the dielectric layer 380 and the composite dielectric structure 260—e.g., the transition between the TEOS process depositing the dielectric layer 380 and the CVD process depositing the composite dielectric structure 260, the adhesion between the $SiO_2$ layer formed by the TEOS process and the first dielectric layer 265. In some embodiments, the total thickness of the composite dielectric structure 260 (denoted as T in FIG. 3) may range between 1 to 2 micrometers (μm). In some embodiments, the thickness of the dielectric layer 380 (denoted as t0 in FIG. 3) may be determined to provide adequate thickness of the conductive pads 125 such that the conductive pads 125 can form robust interconnects (e.g., the interconnects 440) during the direct bonding process.

FIG. 4 is a schematic diagram 400 of a semiconductor die assembly configured in accordance with embodiments of the present technology. The diagram 400 illustrates a bonding interface 405 between semiconductor dies 401a/b directly bonded to each other. The semiconductor dies 401a/b may be examples of the semiconductor die 301 described with reference to FIG. 3—i.e., the semiconductor dies 401a/b include the composite dielectric structure 260 described with reference to FIGS. 2 and 3 as part of their dielectric layers 420a/b. In this regard, the orientation of the dielectric layer 420a corresponds to that of the dielectric layer 320 depicted in FIG. 3, while the orientation of the dielectric layer 420b is upside down (e.g., flipped) with respect to the dielectric layer 320 depicted in FIG. 3.

Similar to the bonding interface 105 described with reference to FIG. 1, the bonding interface 405 may include irregularities (e.g., defects, particles). For example, the diagram 400 illustrates an irregularity 145 at the bonding interface 405. As described herein, the dielectric layer 420a (and the dielectric layer 420b) includes the composite dielectric structure 260 configured to conform to one or more irregularities at the bonding interface 405. As such, a void associated with the irregularity 145 may be absent at the bonding interface 405 (or substantially reduced in its size (not shown)). In this manner, the bonding interface 405 may be improved when compared to the bonding interface 105. For example, the bonding interface 405, in comparison to the bonding interface 105, may have enhanced bonding strength at least due to increased bonding areas, reduced quantities of interconnects 440 having high resistance, reduced probabilities of forming leakage paths between interconnects 440, among others. Additionally, or alternatively, the direct bonding process may be carried out in an environment with relatively lenient requirements directed to the particles (e.g., particle sizes and/or distributions), which in turn, may reduce the manufacturing cost of the semiconductor die assembly.

Although the foregoing example embodiment of FIG. 4 includes both semiconductor dies (e.g., the semiconductor dies 401) having the composite dielectric structure 260, the present technology is not limited thereto. For example, in some embodiments, the semiconductor die 401*b* may be replaced with the semiconductor die 101—i.e., a semiconductor die not including the composite dielectric structure 260 as part of its dielectric layer 120. In such embodiments, the composite dielectric structure 260 of the semiconductor die 401*a* may be modified (e.g., by increasing the thickness t2 of the third dielectric layer 275) such that the adverse effect due to the irregularity 145 can be mitigated by the single composite dielectric structure 260 of the semiconductor die 401*a*.

In some embodiments, a semiconductor die assembly includes a package substrate and a die (e.g., the semiconductor die 401*a*) attached to the package substrate. The die includes a semiconductor substrate having integrated circuitry, and a dielectric structure (e.g., the composite dielectric structure 206) over the semiconductor substrate. Further, the dielectric structure includes a first dielectric layer located at a first side of the dielectric structure facing the semiconductor substrate, a second dielectric layer located at a second side of the dielectric structure opposite to the first side, and a third dielectric layer between the first and second dielectric layers, the third dielectric layer configured to conform to one or more irregularities at the second side.

In some embodiments, the third dielectric layer includes a polymer material that is flexible to deform in response to localized pressure generated by the one or more irregularities. In some embodiments, the semiconductor die assembly further includes one or more conductive pads formed in the dielectric structure, each conductive pad extending through the dielectric structure and configured to couple with at least one through-substrate via (TSV) coupled to the integrated circuitry. In some embodiments, the die is a first die, and the semiconductor die assembly further includes a second die (e.g., the semiconductor die 101) directly bonded to the first die at the second side, where the second die includes a fourth dielectric layer directly bonded to the second dielectric layer, the second die being exclusive of the polymer material.

In some embodiments, the die is a first die and the dielectric structure is the first dielectric structure, and the semiconductor die assembly further includes a second die (e.g., the semiconductor die 401*b*) directly bonded to the first die, wherein the second die includes a second dielectric structure (e.g., the composite dielectric structure 260) having a fourth dielectric layer directly bonded to the second dielectric layer at the second side, a fifth dielectric layer next to the fourth dielectric layer, the fifth dielectric layer configured to conform to the one or more irregularities at the second side, and sixth dielectric layer next to the fifth dielectric layer, the sixth dielectric layer facing a second semiconductor substrate of the second die.

Figure 5:
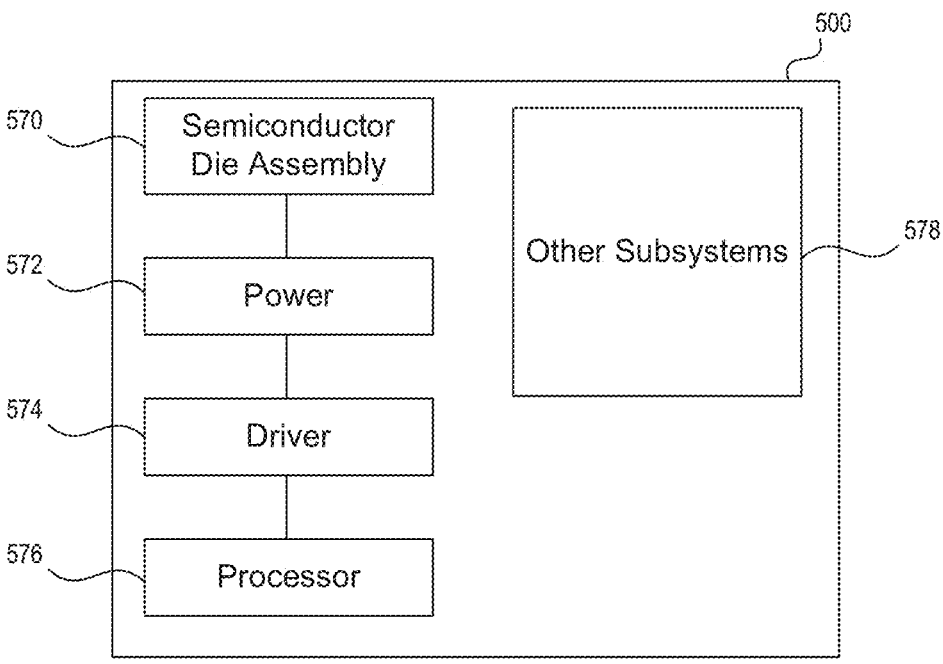
FIG. 5 is a block diagram schematically illustrating a system including a semiconductor die assembly configured in accordance with embodiments of the present technology.

FIG. 5 is a block diagram schematically illustrating a system 500 including a semiconductor die assembly configured in accordance with embodiments of the present technology. The system 500 can include a semiconductor device assembly 570, a power source 572, a driver 574, a processor 576, and/or other subsystems or components 578. The semiconductor device assembly 570 can be incorporated into any of a myriad of larger and/or more complex systems, a representative example of which is the system 500 shown schematically in FIG. 5. The semiconductor die assembly described with reference to FIG. 4 may be included in the semiconductor device assembly 570 of the system 500.

The semiconductor device assembly 570 can have features generally similar to the semiconductor die assembly described herein with reference to FIG. 4. For example, the semiconductor device assembly 570 may include two semiconductor dies that are directly bonded to each other. At least one of the semiconductor dies may include a composite dielectric structure having a flexible dielectric layer that can tolerate irregularities (e.g., defects, particles) present at the bonding interface. The flexible dielectric layer may include a polymer material configured to deform in response to localized pressure generated by the irregularities during the direct bonding process steps. The composite dielectric structure includes additional dielectric layers sandwiching the flexible dielectric layer such that the composite dielectric structure can provide robust bonding strength to other dielectric layers through the additional dielectric layers. In some embodiments, a chemical vapor deposition process may be used to form the composite dielectric structure utilizing siloxane derivatives as a precursor.

The resulting system 570 can perform any of a wide variety of functions, such as memory storage, data processing, and/or other suitable functions. Accordingly, representative systems 570 can include, without limitation, handheld devices (e.g., mobile phones, tablets, digital readers, and digital audio players), computers, and appliances. Components of the system 570 may be housed in a single unit or distributed over multiple, interconnected units (e.g., through a communications network). The components of the system 570 can also include remote devices and any of a wide variety of computer readable media.

FIG. 6 is a flowchart 600 of a method of making a composite dielectric structure in accordance with embodiments of the present technology. The flowchart 600 may include aspects of methods as described with reference to FIGS. 2 through 5.

The method comprises providing a semiconductor die including a substrate having integrated circuitry (box 610). The method further comprises forming a dielectric structure over the substrate, the dielectric structure including a first dielectric layer located at a first side of the dielectric structure facing the substrate, a second dielectric layer located at a second side of the dielectric structure opposite to the first side, and a third dielectric layer between the first and second dielectric layers, the third dielectric layer configured to conform to one or more irregularities at the second side (box 615).

In some embodiments, forming the dielectric structure over the substrate includes depositing the first dielectric layer over the substrate in a chemical vapor deposition (CVD) chamber, depositing the third dielectric layer on the first dielectric layer in the CVD chamber without breaking a vacuum of the CVD chamber, and depositing the second dielectric layer on the third dielectric layer in the CVD chamber without breaking the vacuum of the CVD chamber. In some embodiments, the third dielectric layer includes a polymer material that is flexible to deform in response to localized pressure generated by the one or more irregularities.

In some embodiments, forming the dielectric structure over the substrate includes placing the semiconductor die in a chemical vapor deposition (CVD) chamber configured to receive a first gas having oxygen and a second gas having a precursor including the polymer material, providing the first and second gases to the CVD chamber with a first ratio between the oxygen and the precursor, the first ratio configured to deposit a first silicon oxide material on the semiconductor die, the first silicon oxide material corresponding to the first dielectric layer, modifying an amount of the first gas provided to the CVD chamber to establish a second ratio between the oxygen and the precursor, the second ratio configured to deposit the polymer material on the silicon oxide, the polymer material corresponding to the third dielectric layer, and restoring the amount of the first gas provided to the CVD chamber to establish the first ratio to deposit a second silicon oxide material on the polymer material, the second silicon oxide material corresponding to the second dielectric layer. In some embodiments, the method may further include forming one or more conductive pads in the dielectric structure, each conductive pad extending through the dielectric structure and configured to couple with at least one through-substrate via (TSV) coupled to the integrated circuitry.

It should be noted that the methods described above describe possible implementations, and that the operations and the steps may be rearranged or otherwise modified and that other implementations are possible. Furthermore, embodiments from two or more of the methods may be combined. From the foregoing, it will be appreciated that specific embodiments of the technology have been described herein for purposes of illustration, but that various modifications may be made without deviating from the disclosure. In addition, while in the illustrated embodiments certain features or components have been shown as having certain arrangements or configurations, other arrangements and configurations are possible. Moreover, certain aspects of the present technology described in the context of particular embodiments may also be combined or eliminated in other embodiments.

The devices discussed herein, including a semiconductor device, may be formed on a semiconductor substrate or die, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOS), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

From the foregoing, it will be appreciated that specific embodiments of the invention have been described herein for purposes of illustration, but that various modifications may be made without deviating from the scope of the invention. Rather, in the foregoing description, numerous specific details are discussed to provide a thorough and enabling description for embodiments of the present technology. One skilled in the relevant art, however, will recognize that the disclosure can be practiced without one or more of the specific details. In other instances, well-known structures or operations often associated with memory systems and devices are not shown, or are not described in detail, to avoid obscuring other aspects of the technology. In general, it should be understood that various other devices, systems, and methods in addition to those specific embodiments disclosed herein may be within the scope of the present technology.

What is claimed is:

1. A semiconductor die, comprising:
a substrate including integrated circuitry;
a dielectric structure over the substrate, the dielectric structure including:
a first dielectric layer located at a first side of the dielectric structure facing the substrate;
a second dielectric layer located at a second side of the dielectric structure opposite to the first side; and
a third dielectric layer between the first and second dielectric layers, the third dielectric layer configured to conform to one or more irregularities at the second side, wherein the third dielectric layer includes a polymer material that is flexible to deform in response to localized pressure generated by the one or more irregularities; and
one or more conductive pads formed in and extending through the dielectric structure.

2. The semiconductor die of claim 1, wherein the localized pressure is applied to the third dielectric layer through the second dielectric layer.

3. The semiconductor die of claim 1, wherein the third dielectric layer comprises the polymer material only.

4. The semiconductor die of claim 1, wherein the third dielectric layer primarily comprises the polymer material.

5. The semiconductor die of claim 1, wherein the second dielectric layer is configured to:
conform to the one or more irregularities at the second side; and
directly bond to a fourth dielectric layer in contact with the second dielectric layer,
wherein the fourth dielectric layer is part of a second semiconductor die attached to the semiconductor die.

6. The semiconductor die of claim 1, wherein the first and third dielectric layers comprise, at least one of silicon oxide, silicon nitride, silicon carbon nitride, or silicon carbonate.

7. The semiconductor die of claim 1, wherein:
the second dielectric layer is at least 50 nm thick; and
the third dielectric layer is at least twice thick as the second dielectric layer.

8. The semiconductor die of claim 1, wherein a thickness of the third dielectric layer is determined by sizes of the one or more irregularities.

9. The semiconductor die of claim 1, wherein the one or more conductive pads are each configured to couple with at least one through-substrate via (TSV) coupled to the integrated circuitry.

10. A method, comprising:
providing a semiconductor die including a substrate having integrated circuitry;
forming a dielectric structure over the substrate, the dielectric structure including:
a first dielectric layer located at a first side of the dielectric structure facing the substrate;
a second dielectric layer located at a second side of the dielectric structure opposite to the first side; and
a third dielectric layer between the first and second dielectric layers, the third dielectric layer configured to conform to one or more irregularities at the second side, wherein the third dielectric layer includes a polymer material that is flexible to deform in response to localized pressure generated by the one or more irregularities; and forming one or more conductive pads in the dielectric structure, each conductive pad extending through the dielectric structure.

11. The method of claim 10, wherein forming the dielectric structure over the substrate includes:

depositing the first dielectric layer over the substrate in a chemical vapor deposition (CVD) chamber;

depositing the third dielectric layer on the first dielectric layer in the CVD chamber without breaking a vacuum of the CVD chamber; and depositing the second dielectric layer on the third dielectric layer in the CVD chamber without breaking the vacuum of the CVD chamber.

12. The method of claim 10, wherein forming the dielectric structure over the substrate includes:

placing the semiconductor die in a chemical vapor deposition (CVD) chamber configured to receive a first gas having oxygen and a second gas having a precursor including the polymer material;

providing the first and second gases to the CVD chamber with a first ratio between the oxygen and the precursor, the first ratio configured to deposit a first silicon oxide material on the semiconductor die, the first silicon oxide material corresponding to the first dielectric layer;

modifying an amount of the first gas provided to the CVD chamber to establish a second ratio between the oxygen and the precursor, the second ratio configured to deposit the polymer material on the silicon oxide, the polymer material corresponding to the third dielectric layer; and restoring the amount of the first gas provided to the CVD chamber to establish the first ratio to deposit a second silicon oxide material on the polymer material, the second silicon oxide material corresponding to the second dielectric layer.

13. The method of claim 10, wherein the one or more conductive pads are each configured to couple with at least one through-substrate via (TSV) coupled to the integrated circuitry.

14. A semiconductor die assembly, comprising:

a package substrate; and a die attached to the package substrate, the die including:

a semiconductor substrate having integrated circuitry;

a dielectric structure over the semiconductor substrate, the dielectric structure including:

a first dielectric layer located at a first side of the dielectric structure facing the semiconductor substrate;

a second dielectric layer located at a second side of the dielectric structure opposite to the first side; and a third dielectric layer between the first and second dielectric layers, the third dielectric layer configured to conform to one or more irregularities at the second side, wherein the third dielectric layer includes a polymer material that is flexible to deform in response to localized pressure generated by the one or more irregularities; and one or more conductive pads formed in the dielectric structure, each conductive pad extending through the dielectric structure.

15. The semiconductor die assembly of claim 14, wherein the one or more conductive pads are each configured to couple with at least one through-substrate via (TSV) coupled to the integrated circuitry.

16. The semiconductor die assembly of claim 15, wherein the die is a first die, and the semiconductor die assembly further comprises:

a second die directly bonded to the first die at the second side, wherein the second die includes a fourth dielectric layer directly bonded to the second dielectric layer, the second die being exclusive of the polymer material.

17. The semiconductor die assembly of claim 15, wherein the die is a first die and the dielectric structure is the first dielectric structure, and the semiconductor die assembly further comprises:

a second die directly bonded to the first die, wherein the second die includes a second dielectric structure having:

a fourth dielectric layer directly bonded to the second dielectric layer at the second side;

a fifth dielectric layer next to the fourth dielectric layer, the fifth dielectric layer configured to conform to the one or more irregularities at the second side; and a sixth dielectric layer next to the fifth dielectric layer, the sixth dielectric layer facing a second semiconductor substrate of the second die.

* * * * *